(12) United States Patent
Park et al.

(10) Patent No.: US 8,270,227 B2
(45) Date of Patent: Sep. 18, 2012

(54) NONVOLATILE MEMORY DEVICE AND METHOD OF READING SAME

(75) Inventors: Jae-Woo Park, Suwon-si (KR); Ohsuk Kwon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 272 days.

(21) Appl. No.: 12/717,245

(22) Filed: Mar. 4, 2010

(65) Prior Publication Data
US 2010/0232221 A1 Sep. 16, 2010

(30) Foreign Application Priority Data

Mar. 10, 2009 (KR) .................. 10-2009-0020329

(51) Int. Cl.
*G11C 7/00* (2006.01)
(52) U.S. Cl. ............... 365/189.05; 365/203; 365/233.1; 365/233.17; 365/233.19
(58) Field of Classification Search ............. 365/189.05, 365/233.1, 233.17, 233.19, 203
See application file for complete search history.

(56) References Cited

U.S. PATENT DOCUMENTS

| | | | |
|---|---|---|---|
| 6,480,419 B2 * | 11/2002 | Lee | 365/185.18 |
| 6,614,070 B1 * | 9/2003 | Hirose et al. | 257/316 |
| 7,099,213 B2 * | 8/2006 | Ju | 365/203 |
| 7,196,928 B2 | 3/2007 | Chen | |
| 7,372,730 B2 | 5/2008 | Chen | |
| 2008/0094901 A1 | 4/2008 | Park et al. | |

FOREIGN PATENT DOCUMENTS

| | | |
|---|---|---|
| KR | 1020070007283 A | 1/2007 |
| KR | 1020080016543 A | 2/2008 |
| KR | 100822804 B1 | 4/2008 |
| WO | 2005073978 A1 | 8/2005 |
| WO | 2006107729 A1 | 10/2006 |

* cited by examiner

*Primary Examiner* — Son Dinh
(74) *Attorney, Agent, or Firm* — Volentine & Whitt, PLLC

(57) ABSTRACT

A method of reading a nonvolatile memory device comprises sensing data stored in memory cells adjacent to selected memory cells to identify adjacent aggressor cells, and performing separate precharge operations on bitlines connected to selected memory cells having adjacent aggressor cells and on bitlines connected to selected memory cells having adjacent non-aggressor cells.

18 Claims, 12 Drawing Sheets

| Latch Value | | State | Precharge | | Remark |
|---|---|---|---|---|---|
| MSB | LSB | | 1st | 2nd | |
| 1 | 1 | E0 | 0 | X | - |
| 1 | 0 | P1 | X | 0 | Aggressor |
| 0 | 0 | P2 | 0 | X | - |
| 0 | 1 | P3 | X | 0 | Aggressor |

NONVOLATILE MEMORY DEVICE AND METHOD OF READING SAME

STATEMENT OF RELATED APPLICATIONS

This application claims priority under 35 U.S.C. §119 to Korean Patent Application No. 10-2009-0020329 filed on Mar. 10, 2009, the disclosure of which is hereby incorporated by reference in its entirety.

BACKGROUND

Embodiments of the inventive concept relate generally to semiconductor devices, and more particularly, to nonvolatile memory devices and methods of reading the same.

Semiconductor memory devices can be roughly divided into two categories, depending on whether they retain stored data when disconnected to power. These categories include volatile semiconductor memory devices, which lose stored data when disconnected to power, and nonvolatile semiconductor memory devices, which retain stored data even when disconnected from power.

Flash memory is a popular form of nonvolatile memory device. Flash memory is commonly used, for instance, in portable electronic devices, solid state drives, embedded systems and other devices where data storage is required even when power is lost or disconnected.

Two common types of flash memory include NOR-type and NAND-type flash memory devices. In NOR-type flash memories, at least two cell transistors are connected to one bitline in parallel. NOR-type flash memories store data using channel hot electron injection and erase data using Fowler-Nordheim (F-N) tunneling. NAND-type flash memories, on the other hand, include cell transistors connected to a bitline in series, and perform storage and erasing operations using F-N tunneling.

The memory cells in flash memory devices may each store one or more bits of data. To store one bit of data, a memory cell may use a variable threshold voltage that can be adjusted between two different levels corresponding to logic states '1' and '0'. Similarly, to store two bits of data, the memory cell may use a variable threshold voltage that can be adjusted between four different levels corresponding to logic states '00', '01', '10', and '00'. Likewise, memory cells having a variable threshold voltage can be used to store three, four, or more bits by changing the threshold voltage between different levels.

SUMMARY

Embodiments of the inventive concept provide nonvolatile memory devices and related methods of operation. In some embodiments, selected memory cells are identified, data in adjacent memory cells is sensed, and then a sensing operation of the selected memory cells is performed in a sequence determined by a the data in the adjacent memory cells.

According to one embodiment, a method of reading a nonvolatile memory device, comprises sensing data stored in memory cells located adjacent to selected memory cells, and selectively precharging bitlines of the selected memory cells according to a sequence determined by the data stored in the adjacent memory cells.

In certain embodiments, the method further comprises sensing current levels on the bitlines to determine logic states of the selected memory cells. In such embodiments, the bitlines may be connected between a page buffer and a common source line.

In certain embodiments, the data stored in the adjacent memory cells may be examined to distinguish the adjacent memory cells as aggressor memory cells and non-aggressor memory cells, and bitlines connected to non-aggressor memory cells may be precharged before bitlines connected to aggressor memory cells.

In certain embodiments, the adjacent memory cells are divided into a plurality of groups according to logical states of data stored in the adjacent memory cells and whether those logic states are anticipated to cause electrical interference in the selected memory cells.

In certain embodiments, bitlines of the selected memory cells corresponding to each of the plurality of groups are precharged at different times.

In certain embodiments, the plurality of groups comprise a group of aggressor cells and a group of non-aggressor cells.

In certain embodiments, the aggressor cells comprise memory cells that have been programmed from an erase state to a program state.

In certain embodiments, the data stored in the selected memory cells and the adjacent memory cells is organized within the nonvolatile memory device in accordance with a randomization operation. In certain embodiments, after data is read from the selected memory cells, an order of the read data is recovered by a derandomization operation using a random seed from the randomization operation.

In certain embodiments, the nonvolatile memory device comprises a multi-level-cell flash memory device or a OneNAND flash memory device.

According to another embodiment of the inventive concept, a nonvolatile memory device comprises a cell array comprising a plurality of memory cells, a page buffer selectively precharging bitlines of selected memory cells in a sequence based on data stored in memory cells adjacent to the selected memory cells, and a control logic controlling the page buffer to latch data stored in the adjacent memory cells prior to the selective precharging, and to determine the sequence of precharging based on the latched data.

In certain embodiments, the adjacent memory cells are divided into aggressor cells and non-aggressor cells based on the latched data and selected memory cells adjacent to aggressor cells are sensed at a different time from selected memory cells adjacent to non-aggressor cells.

In certain embodiments, the device further comprises a voltage generator providing a first read voltage for reading selected memory cells adjacent to non-aggressor cells and a second read voltage for reading selected memory cells adjacent to aggressor cells.

In certain embodiments, the device further comprises a randomizer configured to perform a randomization operation to reorder data to be stored in the plurality of memory cells.

In certain embodiments, the plurality of memory cells comprise multi-level cells, and in certain embodiments, the aggressor cells exhibit capacitative coupling on the selected memory cells.

BRIEF DESCRIPTION OF THE DRAWINGS

Embodiments of the inventive concept will be more clearly understood from the following detailed description taken in conjunction with the accompanying drawings. In the drawings, like reference numbers denote like features.

DETAILED DESCRIPTION OF THE EMBODIMENTS

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

Some of the described embodiments relate to NAND-type flash memory devices having multi level cells (MLCs) capable of storing two bits. The inventive concept may, however, be embodied by other types of memory devices, including, e.g., those with different configurations and those storing more than two bits per cell.

Data is stored in an MLC by modifying the MLC's threshold voltage to different ranges corresponding to distinct logical states. Different MLCs in an MLC flash memory device tend to exhibit slightly different threshold voltages when programmed to the same state, and therefore each logical state is typically characterized by a threshold voltage distribution rather than a precise threshold voltage value. Example threshold voltage distributions are illustrated in FIGS. 1 and 3B.

The threshold voltage of a cell may be affected by electrical forces from surrounding components. For instance, adjacent memory cells storing electrical charge may cause a slight increase in a cell's threshold voltage. Due to such effects, the threshold voltage distribution of a collection of cells may be skewed under certain program or operating conditions. Memory cells that affect the electrical properties or operation of adjacent cells, e.g., by capacitive coupling or other forms of noise, are referred to as aggressor cells. Memory cells that do not produce such effects are referred to as non-aggressor cells.

Figure 1:
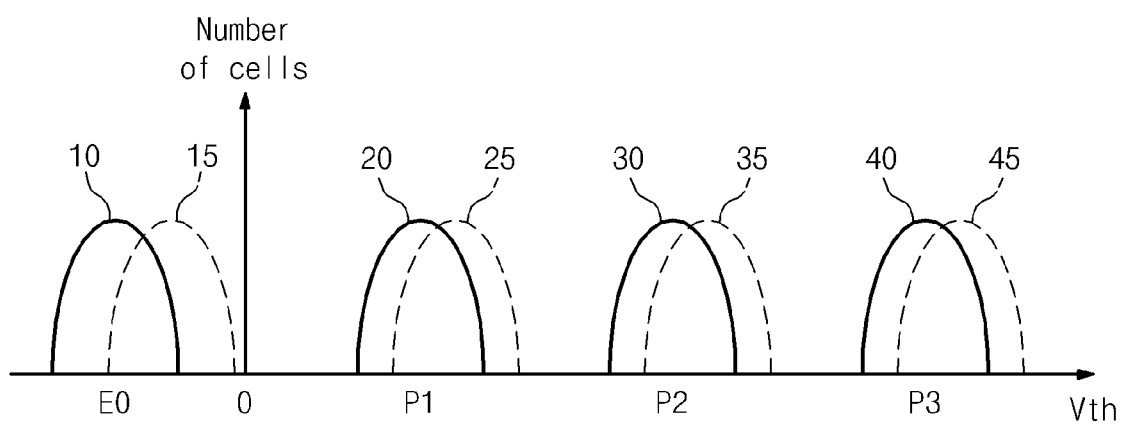
FIG. 1 is a graph illustrating a threshold voltage distribution for a nonvolatile memory device.

FIG. 1 is a block diagram illustrating a threshold voltage distribution of a nonvolatile memory device capable of storing two bits per memory cell. The two bits are represented in FIG. 1 by four distinct distributions. The left-most distribution corresponds to an erased state E0, which can be represented numerically as data '11'. Similarly, the other three distributions, labeled P1, P2 and P3, correspond to programmed states of the memory cell and can be represented numerically as '10', '00' and '01', respectively. This particular mapping of distributions onto states and numbers is provided as a teaching example. However, other mappings are possible and may be used in alternative embodiments. In other words, the states E0, P1, P2 and P3 and the two-bit data corresponding to the states may be rearranged in different memory device designs. Additionally, other embodiments could include multi-level cells (MLCs) storing more than two bits.

The distribution corresponding to state E0 may shift from a position 10 to a position 15 due to the effects of aggressor cells, such as programming disturbance or electrical coupling. Similarly, the distributions corresponding to states P1-P3 may shift from respective positions 20, 30, and 40 to positions 25, 35, and 45 due to the effects of aggressor cells. Such shifting typically occurs after cells have been initially programmed and then surrounding cells are subsequently programmed. The subsequent programming of surrounding cells typically increases the number of surrounding electrical charges, which increases the threshold voltages of the initially programmed cells.

To compensate for these effects, a sensing operation of a single cell may involve simultaneous sensing of adjacent cells and a determination of whether the adjacent cells are aggressor cells influencing the threshold voltage of the single cell. If it is determined that aggressor cells are producing a large amount of noise, the sensed value of the single cell may be deemed invalid. Unfortunately, such sensing operations, denoted multi-step sensing, significantly decreases the read speed of a device. Additionally, the simultaneous sensing of adjacent cells produces another possible source of error in the form of common source line (CSL) noise.

Figure 2:
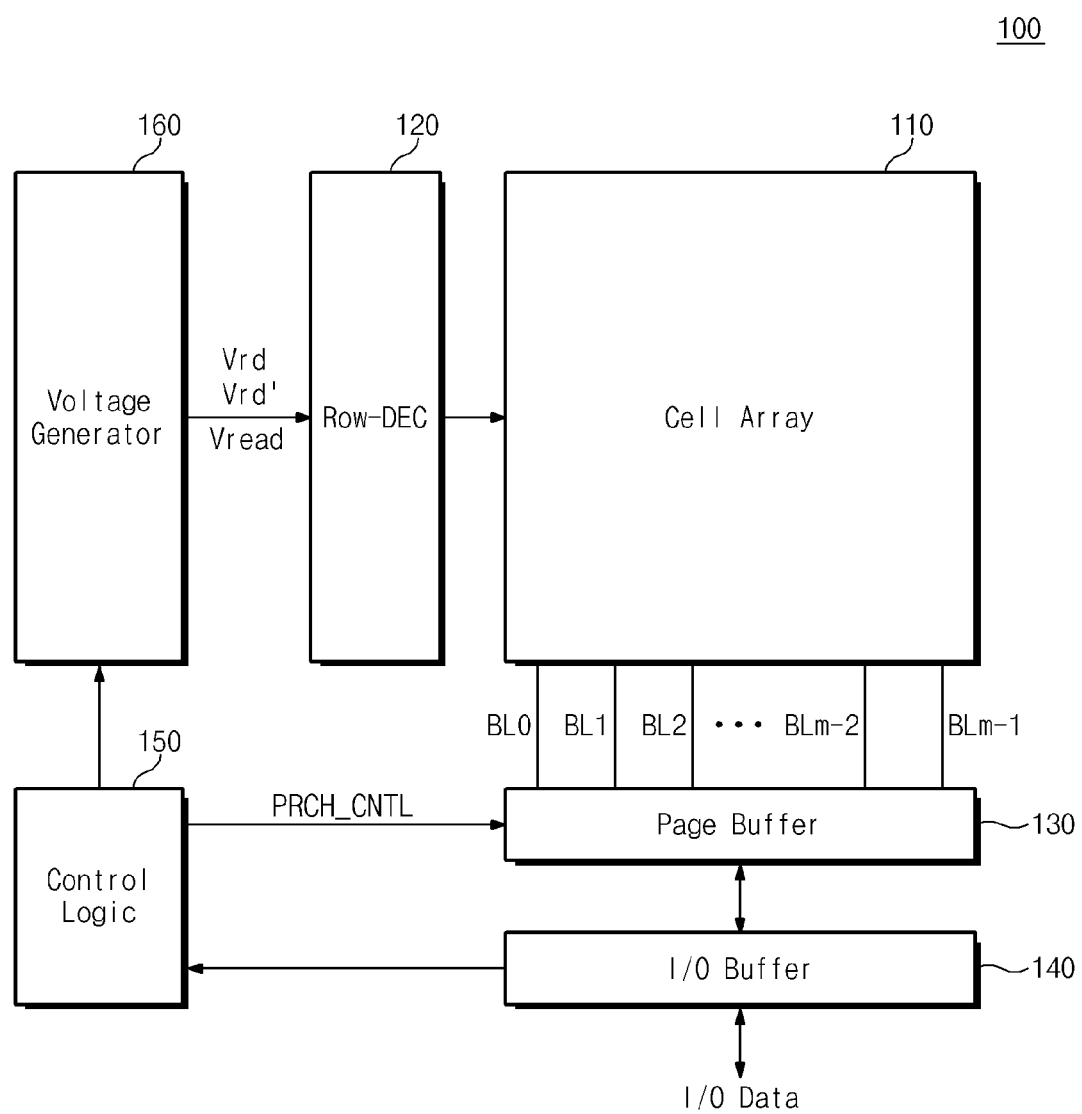
FIG. 2 is a block diagram illustrating a nonvolatile memory device in accordance with an embodiment.

FIG. 2 is a block diagram illustrating a nonvolatile memory device 100 in accordance with an embodiment of the inventive concept. Referring to FIG. 2, nonvolatile memory device 100 selectively precharges, detects and amplifies a bitline of selected memory cells upon receiving information about an aggressor cell in a read operation. The precharging, detecting, and amplifying operations are implemented by control logic 150 and a page buffer 130.

A cell array 110 comprises memory cells connected to a bitline and a wordline. An MLC can be programmed to any one of various threshold voltages to store a plurality of bits. MLCs are typically programmed within a limited threshold voltage window to include a number of threshold voltage states $2^k$ corresponding to a number of bits "k" being stored. Thus, electrical interference between adjacent cells becomes more consequential as the number of bits-per-cell increases. Moreover, as the integration density of memory devices increases, electrical interference may have a greater effect as well. As a result, it may become more important to employ technologies for reducing interference between memory cells of cell array 110.

A row decoder 120 selects a wordline based on a received row address. Row decoder 120 transmits various wordline voltages generated by a voltage generator 160 to selected wordlines. In a program operation, row decoder 120 transmits a program voltage Vpgm (typically about 15-20V) and a verifying voltage to the selected wordline and transmits a pass voltage Vpass to an unselected wordline. In a read operation, row decoder 120 transmits a select read voltage Vrd generated by voltage generator 160 to the selected wordline and transmits a non-selection read voltage Vread (typically about 5V) to an unselected wordline. To read memory cells having threshold voltages that are shifted due to aggressor cells, the select read voltage is generated with a magnitude greater than selection read voltage Vrd.

A page buffer 130 operates as either a write driver or a sense amplifier based on an operation mode. For example, page buffer 130 operates as a sense amplifier in a read operation mode and operates as a writer driver in a program operation mode. Page buffer 130 may perform a bitline precharge operation on a selected memory cell depending on a threshold voltage state of an adjacent cell when a read operation is performed. To determine whether to perform the precharge operation, page buffer 130 performs a read operation on an adjacent cell to determine the threshold voltage state.

Page buffer 130 performs separate bitline precharge operations on selected cells where adjacent cells are identified as aggressor cells and on selected cells where adjacent cells are classified as non-aggressor cells. In one example, page buffer 130 first precharges and senses a bitline of a selected memory cell adjacent to a non-aggressor cell in response to a precharge control signal (PRCH_CNTL). After that, page buffer 130 precharges and senses a bitline of a selected memory cell adjacent to an aggressor cell. The order of these precharge and sensing operations can be variously rearranged.

An input/output buffer 140 temporarily stores an address or program data received through an input/output pin. Input/output buffer 140 transmits the stored address to an address bus (not illustrated), transmits the programmed data to page buffer 130, and transmits a command to a command register (not illustrated). When a read operation is performed, read data provided from page buffer 130 is output through input/output buffer 140.

Control logic 150 controls page buffer 130 or voltage generator 160 according to a read operation procedure being performed. In a read operation, control logic 150 first performs a read operation on cells adjacent to selected memory cells. Then, in a sensing operation of the selected memory cells, control logic 150 controls voltage generator 160 so that voltage generator 160 provides a selection read voltage Vrd or Vrd' of different levels according to program states of the adjacent cells. Where a bitline precharge and a sensing operation are performed on selected memory cells adjacent to non-aggressor cells, control logic 150 controls voltage generator 160 to provide selection read voltage Vrd to a selected wordline. Where a bitline precharge and a sensing operation are performed on selected memory cells adjacent to aggressor cells, control logic 150 controls voltage generator 160 to provide a modified selection read voltage Vrd' to a selected wordline. Selection read voltage Vrd' is typically higher than selection read voltage Vrd.

Voltage generator 160 generates a direct voltage under the control of control logic 150. Voltage generator 160 generates all direct voltages for programming nonvolatile memory device 100 under the control of control logic 150. In particular, voltage generator 160 provides read voltages Vrd, Vrd' and Vread for reading selected memory cells under the control of control logic 150.

Figure 3A:
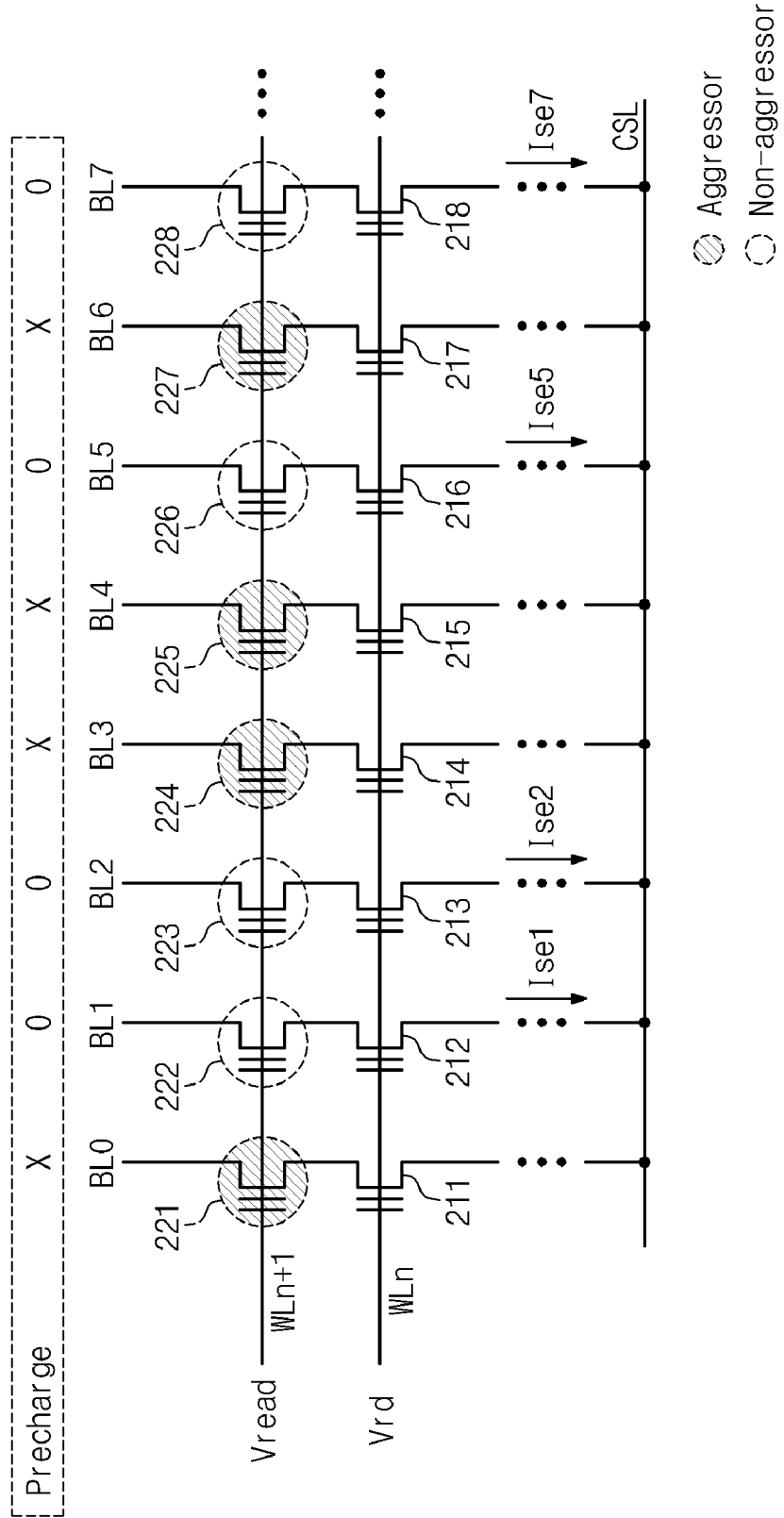
FIGS. 3A and 3B illustrate a sensing operation of memory cells adjacent to non-aggressor cells.
Figure 3B:
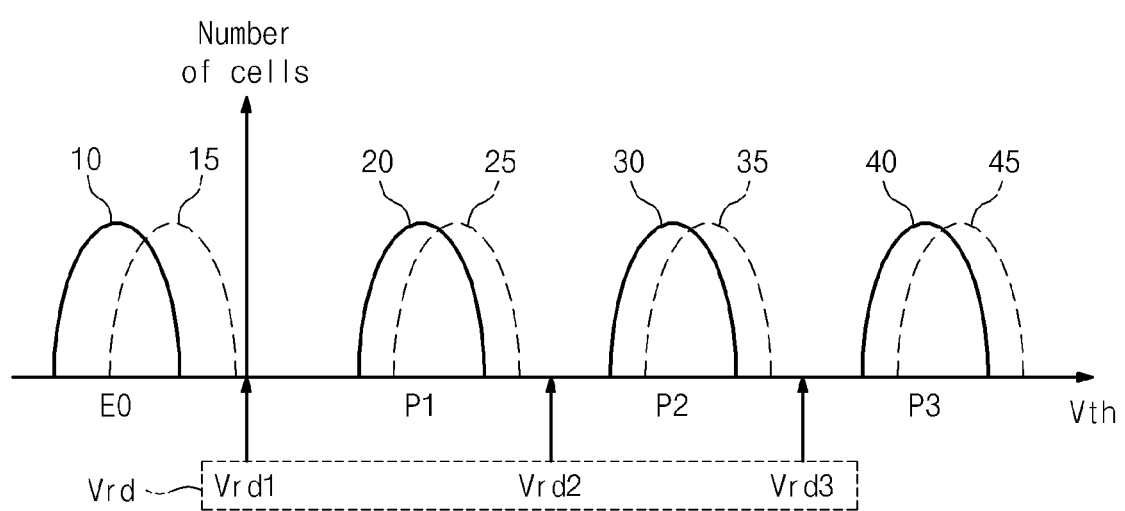
Figure 4A:
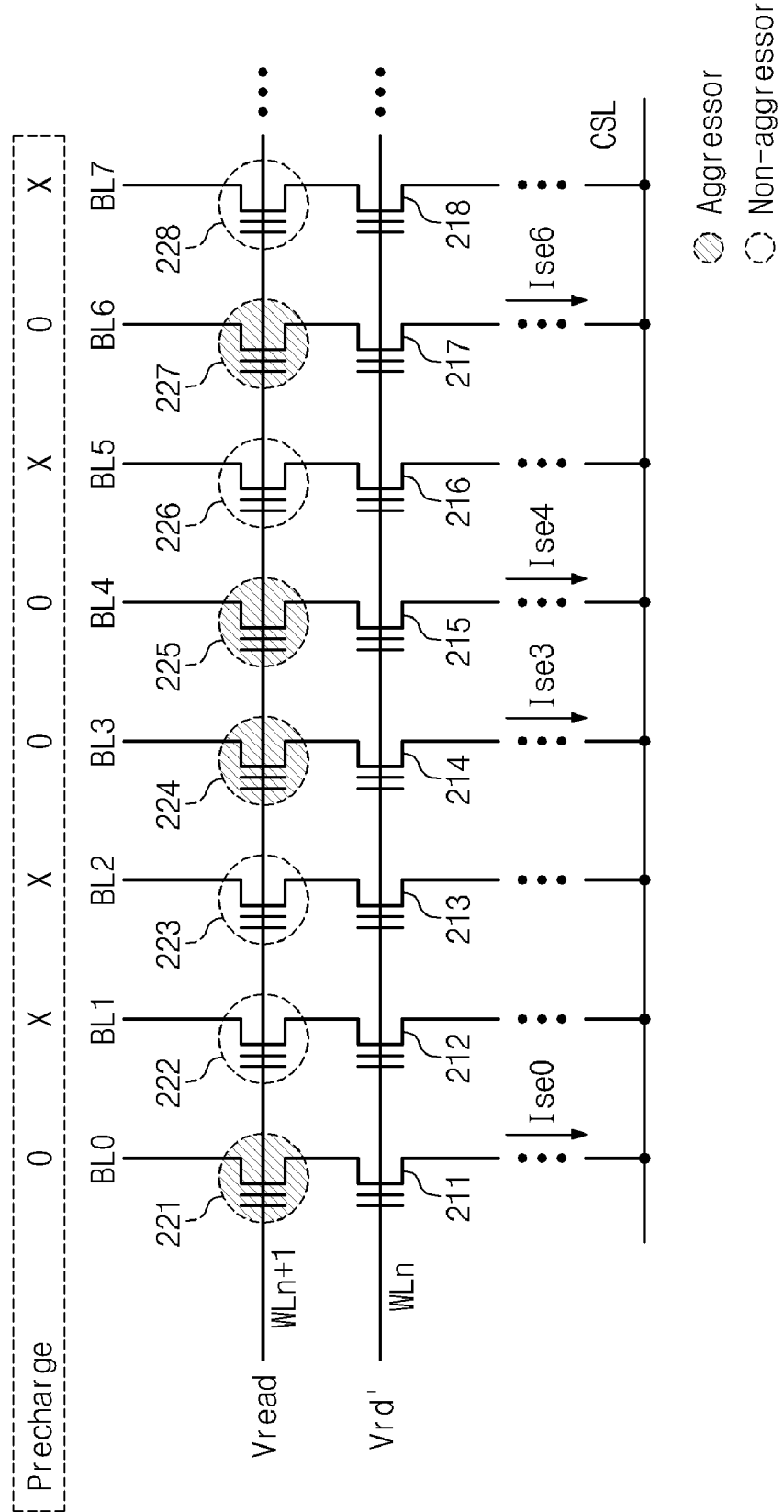
FIGS. 4A and 4B illustrate a sensing operation of memory cells adjacent to aggressor cells.
Figure 4B:
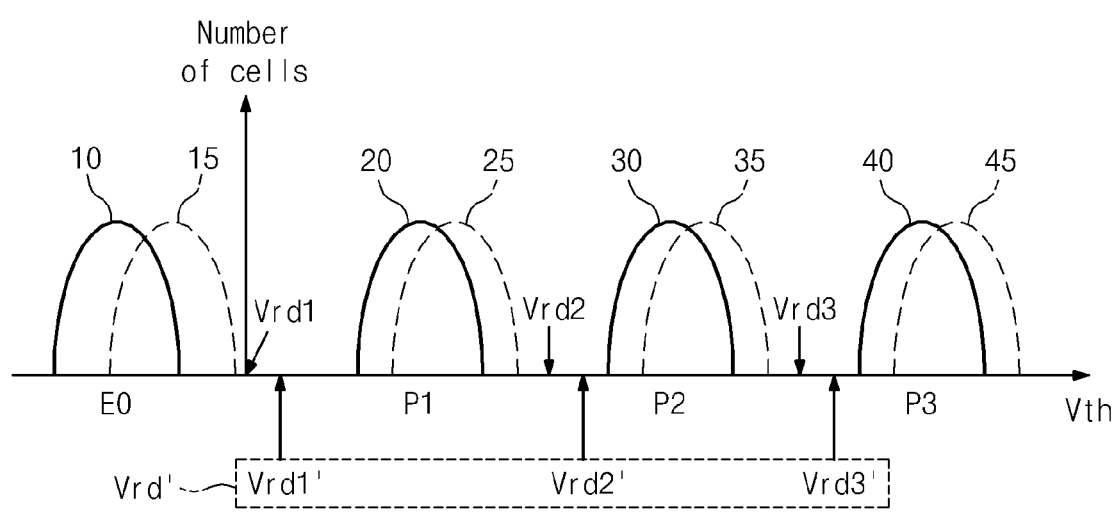

FIGS. 3 and 4 illustrate a method of reading selected memory cells 211 through 218 within cell array 110. In particular, FIGS. 3A and 3B illustrate a method of reading selected memory cells 212, 213, 216, and 218 located adjacent to non-aggressor cells, and FIGS. 4A and 4B illustrate a method of reading selected memory cells 211, 214, 215 and 217 located adjacent to aggressor cells. In the method of FIGS. 3A and 3B, a first read voltage Vrd is applied to a wordline WLn connected to the selected memory cells, and in the method of FIGS. 4A and 4B, a second read voltage Vrd' is applied to wordline WLn.

Referring to FIG. 3A, selected memory cells 211 through 218 are located next to unselected memory cells 221 through 228, respectively. Before a read operation is performed on selected memory cells 211 through 218, a sensing operation is first performed to determine whether any of memory cells 221 through 228 is an aggressor cell. In FIGS. 3A and 4A, aggressor cells are indicated by shaded circles.

Once aggressor cells have been identified, a precharge voltage is applied to bitlines connected to selected memory cells that are not adjacent to aggressor cells. In FIGS. 3A and 4A, bitlines where the precharge voltage is applied are labeled "0" in a box labeled "precharge," and bitlines where the precharge voltage is not applied are labeled "X" in the box labeled "precharge."

While the precharge voltage is applied to the bitlines labeled "0" in FIG. 3A, an non-selection read voltage Vread is applied to a wordline WLn+1, which is connected to memory cells 221 through 228, and a selection read voltage Vrd is applied to wordline WLn. Under these voltage conditions, currents Ise1, Ise2, Ise5, and Ise7 may flow through any of bitlines BL1, BL2, BL5, and BL7 to a common source line CSL, depending on the respective program states of the corresponding memory cells 212, 213, 216 and 218. For instance, if memory cell 212 is programmed to a state where its threshold voltage exceeds the read voltage Vrd, memory cell 212 will impede current from flowing through bitline BL1 to common source line CSL.

FIG. 3B shows three different read voltages Vrd1, Vrd2 and Vrd3 that can be used to detect the state of memory cells 212, 213, 216 and 218. Read voltage Vrd1 can be used to determine whether a memory cell is in a state other than state E0, read voltage Vrd2 can be used to determine whether a memory cell is in a state other than states E0 and P1, and read voltage Vrd3 can be used to determine whether a memory cell is in a state other than states E0, P1 and P2.

FIGS. 4A and 4B illustrate a method of reading selected memory cells adjacent to aggressor cells. In the method of FIG. 4A, bitlines BL0, BL3, BL4 and BL6 are precharged, non-selection read voltage Vread is applied to wordline WLn+1, and a modified selection read voltage Vrd' is applied to wordline WLn connected to selected memory cells 211 through 218. Under these voltage conditions, currents Ise0, Ise3, Ise4, and Ise6 may flow through any of bitlines BL0, BL3, BL4, and BL6 to common source line CSL, depending on the respective program states of the corresponding memory cells 211, 214, 215 and 217.

As illustrated by FIG. 4B, modified selection read voltage Vrd' is greater than selection read voltage Vrd of FIGS. 3A and 3B. This increase in the read voltage addresses the shift of threshold voltage distributions 10, 20, 30 and 40 to distributions 15, 25, 35 and 45 due to aggressor cells. Thus, the use of a different read voltage for memory cells adjacent to aggressor cells prevents read errors from occurring due to the shift of threshold voltage distributions.

Figures 5, 6:
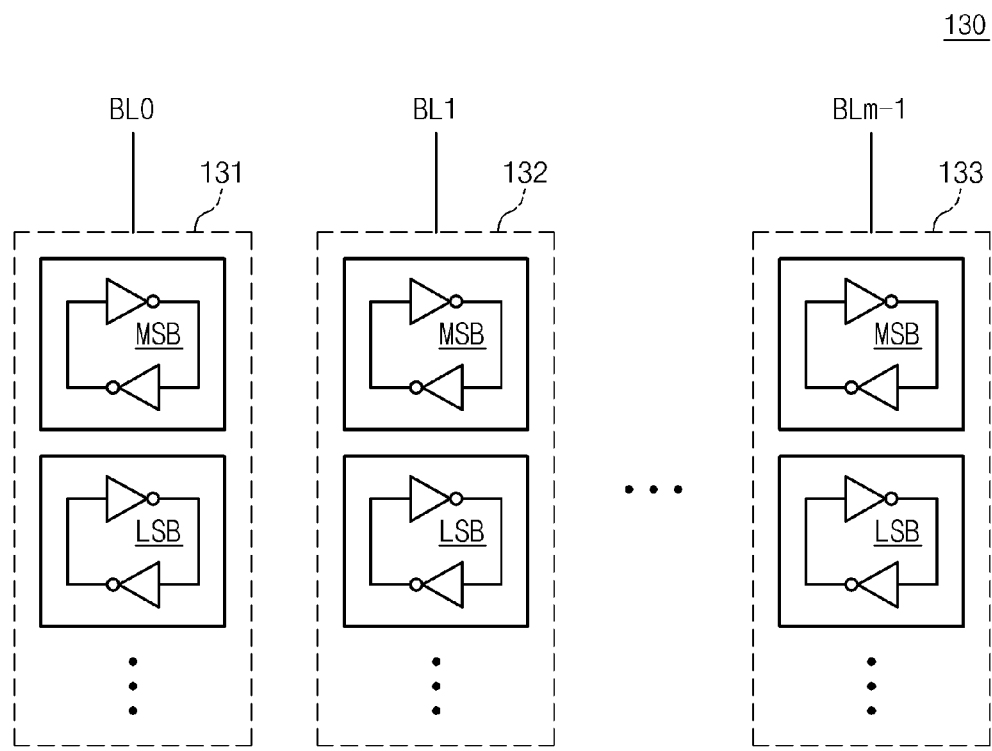
FIG. 5 is a block diagram illustrating a page buffer structure that can be used in selected embodiments.
FIG. 6 is a table illustrating precharge states of a bitline in some embodiments.

FIG. 5 is a block diagram illustrating an embodiment of page buffer 130. Referring to FIG. 5, page buffer 130 comprises a plurality of page buffer circuits 131 through 133 corresponding to respective bitlines BL0 through BLm−1.

Page buffer circuits 131 through 133 precharge bitlines BL0 through BLm−1 to read corresponding memory cells. For instance, in the read operation of FIGS. 3 and 4, page buffer circuits 131 through 133 first precharge bitlines connected to selected memory cells that are not located adjacent to aggressor cells, then page buffer circuits 131 through 133 precharge the remaining bitlines connected to the selected memory cells. To perform this operation, each of page buffer circuits 131 through 133 senses and stores data from memory cells adjacent to the selected memory cells. To store this data, each page buffer circuit comprises latches for storing the bits stored in the adjacent memory cells. In this embodiment, the latches store two bits from each adjacent memory cell. In particular, the latches in each page buffer circuit store a most significant bit (MSB) and a least significant bit (LSB) from an adjacent memory cell.

If the latches in one of the page buffer circuits store a logical value "11" as the MSB and LSB, the corresponding sensed adjacent memory cell is determined to be in the erased state E0. Similarly, if the latches store a logical value "10," "00," or "01" as the MSB and LSB, the corresponding sensed adjacent memory cell is determined to be in one of the programmed states P1, P2 and P3.

After a read operation has been performed on adjacent cells, a precharge enable signal PRCH_EN is provided to page buffer 130 from control logic 150. Then, page buffer circuits 131 through 133 precharge corresponding bitlines based on the logical values stored in the latches. The page buffer circuits first precharge bitlines connected to selected memory cells having adjacent aggressor cells, and then they later precharge bitlines connected to selected cells having adjacent aggressor cells.

In addition to precharging the bitlines connected to the selected memory cells, page buffer circuits 131 through 133 also sense and store the logic states of the selected memory cells. In particular, where selection read voltage Vrd is applied to a wordline connected to selected memory cells adjacent to non-aggressor cells, buffer circuits 131 through 133 detect and store the logic states of those cells in sense latches (not shown). Similarly, when modified selection read voltage Vrd' is applied to the wordline connected to selected memory cells adjacent to aggressor cells, page buffer circuits 131 through 133 detect and store the logic states of those cells in the sense latches.

Although the above embodiment applies a precharge operation first to bitlines where selected memory cells are located adjacent to non-aggressor cells, and later applies the precharge operation to bitlines where selected memory cells are located adjacent to aggressor cells, the order of applying the precharge operation could be reversed.

FIG. 6 is a table illustrating an example relationship between latch values stored in a page buffer circuit, and a precharge operation performed on a corresponding bitline. In the example of FIG. 6, where the latch stores the logic value "11" or "00" corresponding to states E0 or P2, a selected memory cell connected to the corresponding bitline is located adjacent to a non-aggressor cell. On the other hand, where the latch stores the logical value "10" or "01" corresponding to states P1 or P3, the selected memory cell connected to the corresponding bitline is located adjacent to an aggressor cell. Accordingly, where the latch stores logic value "11" or "00," a precharge voltage is applied to the bitline in the first phase of a precharge operation (labeled "$1^{st}$" in FIG. 6) to read data from the selected memory cell; and where the latch stores logic value "10" or "01," the precharge voltage is applied to the bitline in the first phase of a precharge operation to read data from the selected memory cell (labeled "$2^{nd}$" in FIG. 6).

As indicated by the table, during a read operation, page buffer 130 selectively performs a precharge operation on a bitline of a selected memory cell based on the result of a read operation on an adjacent cell. Thus, a read speed can be improved while reducing a noise on the CSL.

Figure 7:
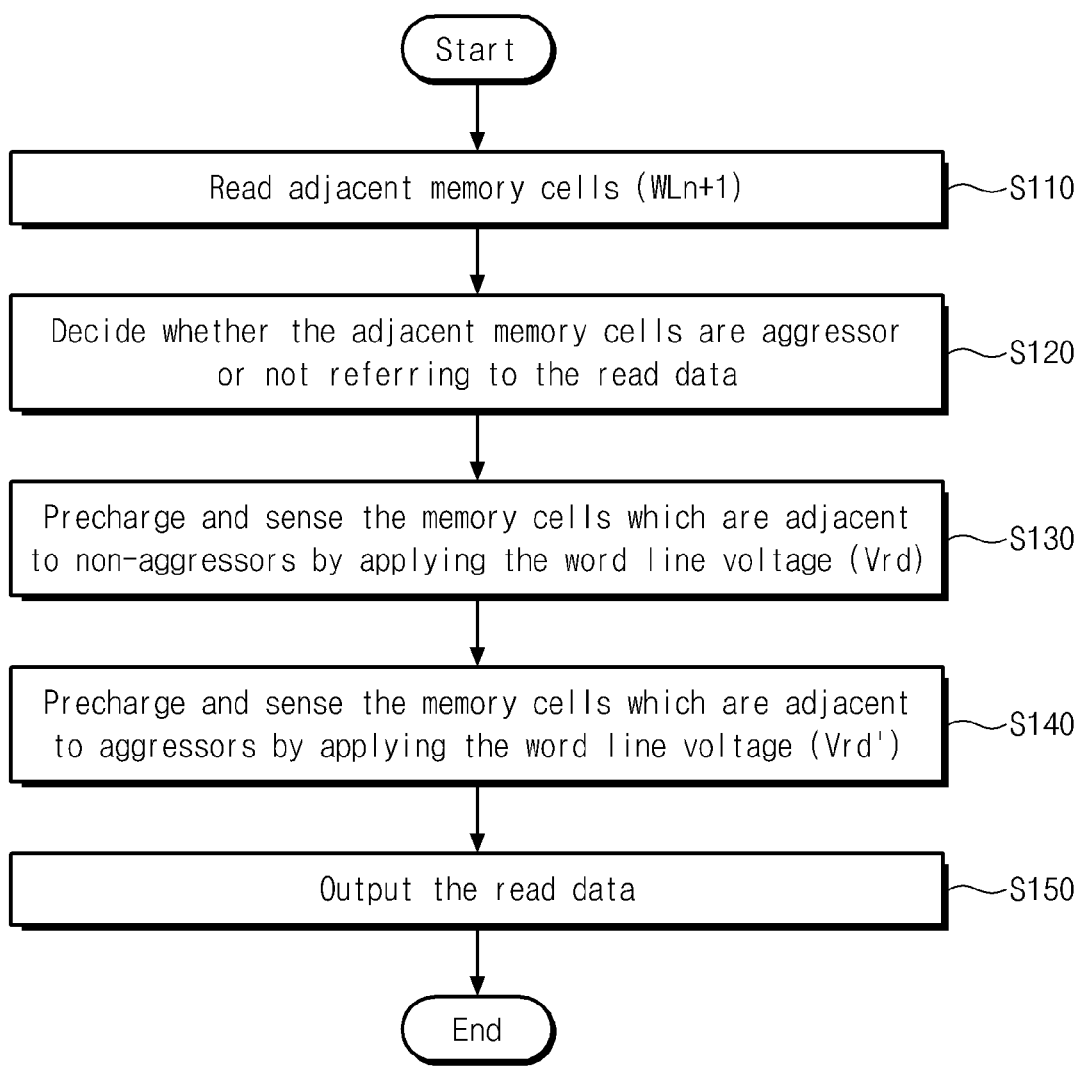
FIG. 7 is a flow chart illustrating a read operation of a memory device in accordance with an embodiment.

FIG. 7 is a flow chart illustrating a method of performing read operation in nonvolatile memory device 100 according to one embodiment. In the method of FIG. 7, a bitline is precharged at a different time depending on the state of a memory cell adjacent to a selected memory cell. In the following description, example method steps are denoted by parentheses (SXXX).

Referring to FIG. 7, control logic 150 controls voltage generator 160 and page buffer 130 to perform a read operation on memory cells connected to a wordline WLn+1 and located adjacent to selected memory cells connected to a wordline WLn (S110). The results of the read operation are stored in a plurality of latches within page buffer 130.

The method next determines whether the adjacent memory cells are aggressor cells or a non-aggressor cells based on the logic values stored in the latches (S120). This can be done, for instance, through a mapping such as that illustrated in the table of FIG. 6.

Subsequently, bitlines of selected memory cells adjacent to non-aggressor cells are precharged and changes in the precharged voltages are sensed. During this precharging and sensing, selection read voltage Vrd is applied to wordline WL. The sensed data is stored in sense latches within page buffer 130 (S130).

Next, bitlines of selected memory cells adjacent to aggressor cells are precharged and a changes in the precharged voltages are sensed. During this precharging and sensing, selection read voltage Vrd' is applied to wordline WL. The sensed data is stored in aggressor cell is stored in sense latches within page buffer 130 (S140).

Finally, the data read from the selected memory cells and stored in the sense latches of page buffer 130 is transmitted to input/output buffer 140 and then output from nonvolatile memory device 100 under the control of control logic 150 (S150).

Figure 8:
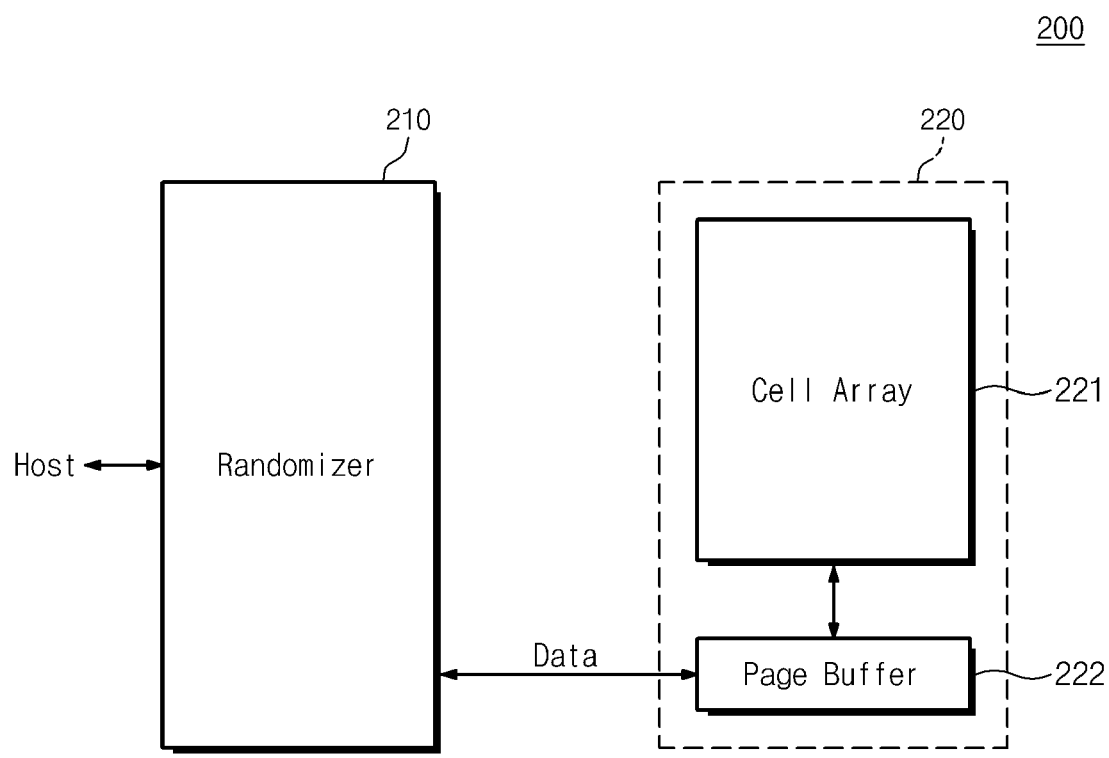
FIG. 8 is a block diagram illustrating a memory system in accordance with an embodiment.

FIG. 8 is a block diagram illustrating a memory system 200 in accordance with an embodiment. Referring to FIG. 8, memory system 200 comprises a nonvolatile memory device 220 and a randomizer 210 that processes data to be stored in nonvolatile memory device 220 using a randomization operation.

Randomizer 210 processes program data provided from a host using a random operation to provide processed program data to nonvolatile memory device 220. When a program operation is performed, randomizer 210 divides program data provided from the host into predetermined data units and performs a random operation on each unit of divided program data. The resulting randomized data is transmitted to nonvolatile memory device 220 together with a random seed having random information.

The randomized data and the random seed are programmed in a predetermined area of nonvolatile memory device 220. When a read operation is performed, randomizer 210 restores the read data to an original arrangement using the random seed provided from nonvolatile memory device 220. The resulting restored data is then transmitted to the host. Randomizer 210 may be implemented in a variety of ways, such as in hardware, software, or firmware.

Nonvolatile memory device 220 writes program data provided from randomizer 210 in nonvolatile memory cells of a cell array 221. Program data encoded by randomizer 210 is temporarily loaded in a page buffer 222 of nonvolatile memory device 220. The program data loaded in page buffer 222 is written in cell array 221. When a read command is provided from the host, nonvolatile memory device 220 senses data stored in cell array 221 and stores the sensed data in page buffer 222. The read data stored in page buffer 222 is transmitted to randomizer 210. Randomizer 210 decodes the read data using the random seed and the decoded data is transmitted to the host. In this embodiment, nonvolatile memory device 220 is substantially identical to nonvolatile memory device 100 illustrated in FIG. 2.

With the data arrangement produced by randomizer 210, data transmitted to nonvolatile memory device 220 is not biased to a specific program state and are uniformly distributed. In other words, the randomization prevents certain pages of data from being biased toward aggressor or non-aggressor cells. By preventing such biases, CSL noise can be reduced during two stage reading operations such as that illustrated in FIG. 7. By reducing CSL noise, randomizer 210 may improve read performance of a nonvolatile memory device.

Here, randomizer 210 may be included in the inside of nonvolatile memory device 220. Randomizer 210 could alternatively be included in another location such as inside a memory controller.

Figure 9:
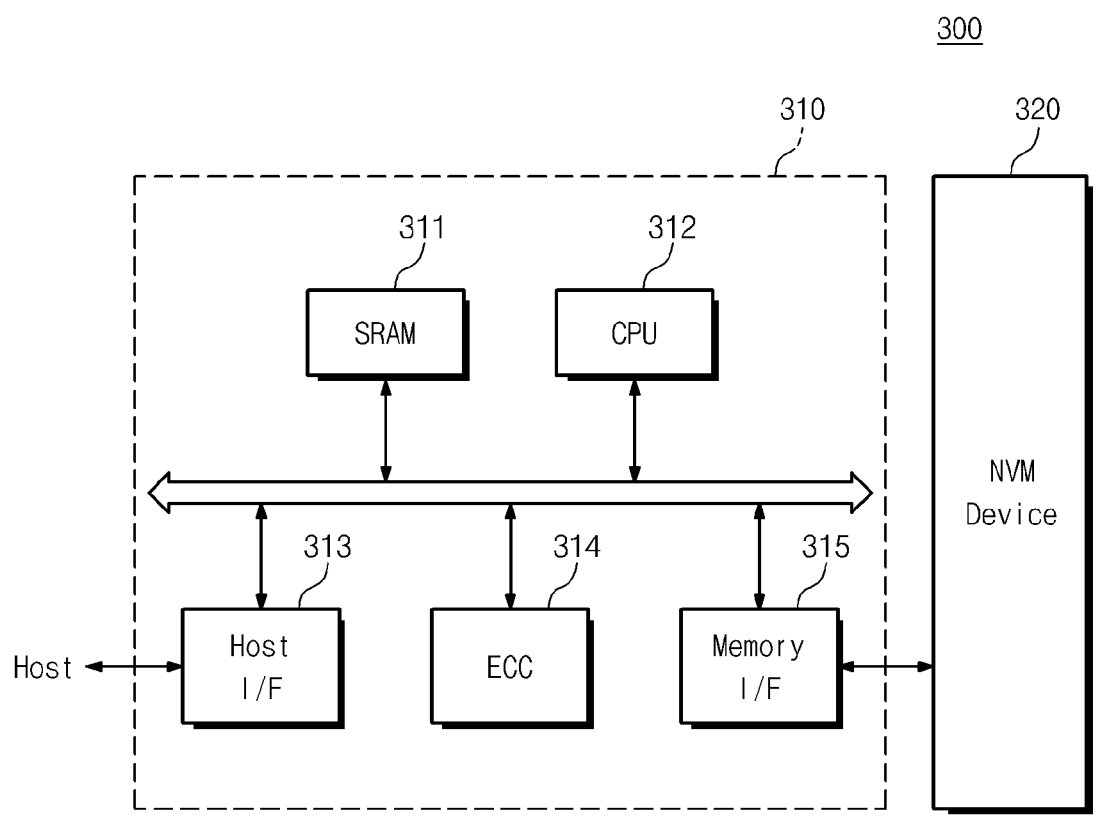
FIG. 9 is a block diagram illustrating a memory system in accordance with an embodiment.

FIG. 9 is a block diagram illustrating a memory system 300 in accordance with another embodiment. Referring to FIG. 9, memory system 300 comprises a nonvolatile memory device 320 and a memory controller 310.

In certain embodiments, nonvolatile memory device 320 comprises a flash memory device having cell array 110. Memory controller 310 is configured to control nonvolatile memory device 320. A memory card or a solid state disk (SSD) may be formed by combining nonvolatile memory device 320 with memory controller 310.

Memory controller 310 comprises a central processing unit (CPU) 312 and an SRAM 311 used as the working memory of CPU 312. Memory controller 310 further comprises a host interface 313 implementing a data exchange protocol with a host connected to memory system 300, an error correction block 314 detecting and correcting errors included in data read from nonvolatile memory device 320, and a memory interface 315 interfacing with nonvolatile memory device 320.

Processing unit 312 performs control operations for data exchange of memory controller 310. Although not illustrated in FIG. 9, memory system 300 may further comprise a ROM storing code data for communicating with the host. Nonvolatile memory device 320 may be provided as a multi-chip package comprising a plurality of flash memory chips. Memory system 300 may comprise a high reliability storage medium with a low probability of errors. For instance memory system 300 may comprise a flash memory device or a solid state disk (SSD). Memory controller 310 is configured to communicate with other devices, such as the host, using any of various interface protocols such as USB, MMC, PCI-E, SATA, PATA, SCSI, ESDI and IDE. Memory controller 310 may further comprise a component for performing a randomization operation, such as randomizer 210.

Figure 10:
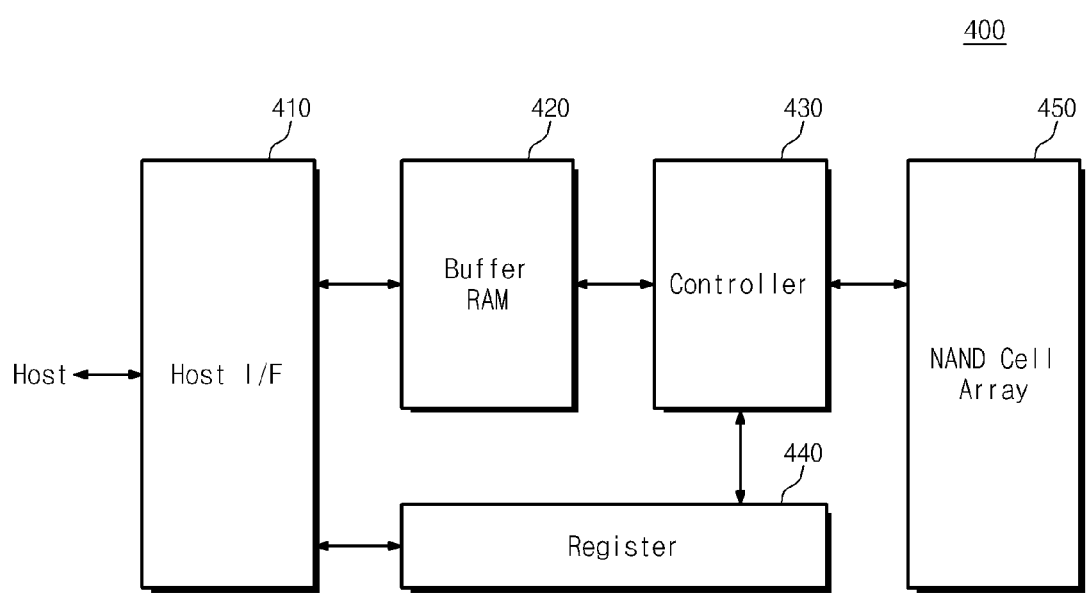
FIG. 10 is a block diagram illustrating a fusion memory device in accordance with an embodiment.

FIG. 10 is a block diagram illustrating a fusion memory device 400 configured to perform a program operation such as those described above. For explanation purposes, it will be assumed that fusion memory device 400 comprises a OneNAND flash memory device. In other embodiments, it could comprise other device types.

Flash memory device 400 comprises a host interface 410 that exchanges information with a device using a different protocol, a buffer RAM 420 that temporarily stores data or stores code for driving a memory device, a controller 430 that controls read and program operations in response to control signals and commands received, e.g., from external devices, a register 440 that stores data such as commands, addresses and configuration data of a memory device, and a NAND flash cell array 450 comprising a nonvolatile memory cell and a page buffer. The one NAND flash memory device 400 selectively performs a bitline precharge operation to read selected memory cells in response to a read request from a host. The precharge operation can be performed in multiple stages based on the presence of adjacent aggressor cells, like the method of FIG. 7.

Figure 11:
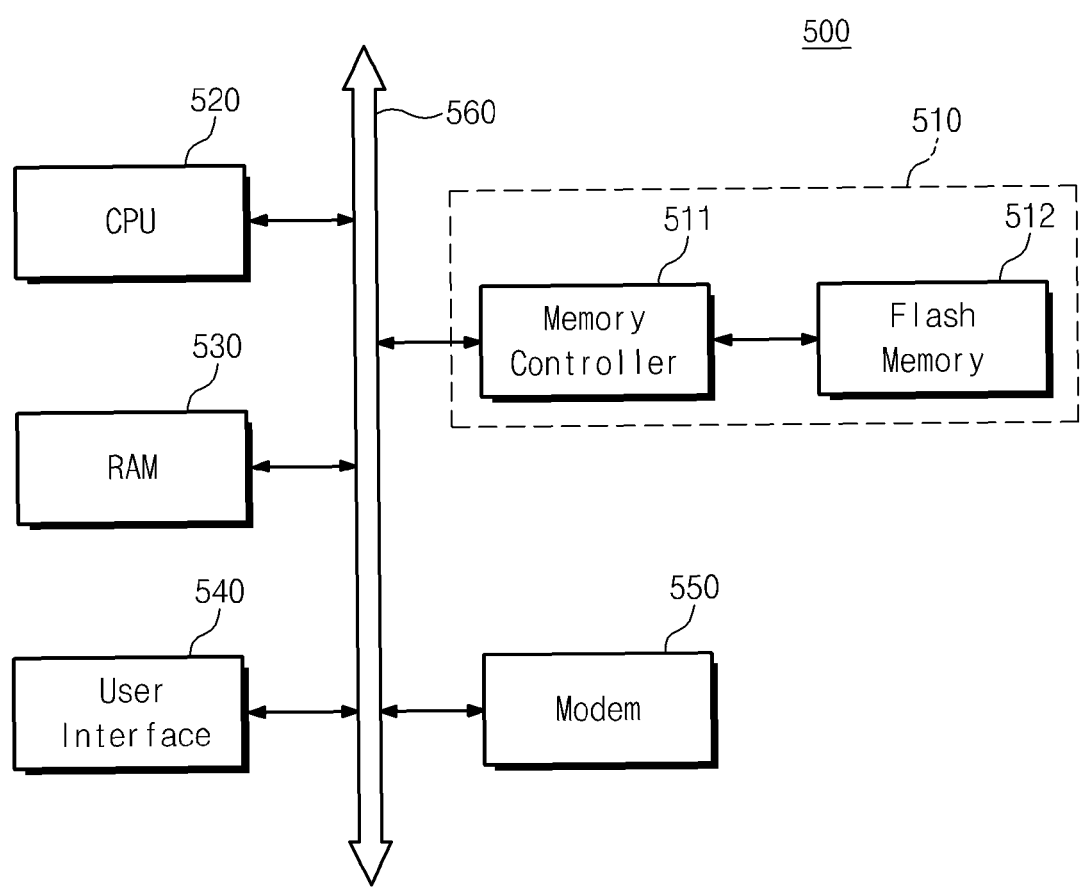
FIG. 11 is a block diagram illustrating a structure of a computing system in accordance with an embodiment.

FIG. 11 is a block diagram illustrating a computing system 500 including a flash memory device 512 in accordance with another embodiment. Computing system 500 comprises a microprocessor 520 electrically connected to a system bus 560, a RAM 530, a user interface 540, a modem 550 such as a baseband chipset and a memory system 510. Memory system 510 may take the form of the memory systems illustrated in FIG. 9 or FIG. 10. If computing system 500 is a mobile device, a battery may included to supply power.

Although not illustrated in FIG. 11, computing system 500 may further comprise an application chipset, a camera image processor (CIS), a mobile DRAM or the like. Memory system 510 may, for example, constitute a SSD using a nonvolatile memory when storing data. In some embodiments, memory system 510 comprises a fusion flash memory. Computing system 500 reads data from memory system 510 using a read operation comprising two precharge stages based on the presence of adjacent aggressor cells, similar to the method of FIG. 7. As a result, computing system 500 may obtain improved access speed access and data reliability.

A flash memory device and/or a memory controller in accordance with an embodiment may be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed:

1. A method of reading a nonvolatile memory device, comprising:
   sensing data stored in memory cells located adjacent to selected memory cells;
   selectively precharging bitlines of the selected memory cells according to a sequence determined by the data stored in the adjacent memory cells; and
   examining the data stored in the adjacent memory cells to distinguish the adjacent memory cells as aggressor memory cells and non-aggressor memory cells.

2. The method of claim 1, further comprising:
   sensing current levels on the bitlines to determine logic states of the selected memory cells.

3. The method of claim 2, wherein the bitlines are connected between a page buffer and a common source line.

4. The method of claim 1, further comprising:
   precharging bitlines connected to non-aggressor memory cells before precharging bitlines connected to aggressor memory cells.

5. A method of reading a nonvolatile memory device, comprising:
   sensing data stored in memory cells located adjacent to selected memory cells; and selectively precharging bitlines of the selected memory cells according to a sequence determined by the data stored in the adjacent memory cells, wherein the adjacent memory cells are divided into a plurality of groups according to logical states of data stored in the adjacent memory cells and whether those logic states are anticipated to cause electrical interference in the selected memory cells.

6. The method of claim 5, wherein bitlines of the selected memory cells corresponding to each of the plurality of groups are precharged at different times.

7. The method of claim 5, wherein the plurality of groups comprise a group of aggressor cells and a group of non-aggressor cells.

8. The method of claim 7, wherein the aggressor cells comprise memory cells that have been programmed from an erase state to a program state.

9. The method of claim 1, wherein the data stored in the selected memory cells and the adjacent memory cells is organized within the nonvolatile memory device in accordance with a randomization operation.

10. The method of claim 9, further comprising:
after reading data from the selected memory cells, recovering an order of the read data by a derandomization operation using a random seed from the randomization operation.

11. The method of claim 1, wherein the nonvolatile memory device comprises a multi-level-cell flash memory device.

12. The method of claim 11, wherein the nonvolatile memory device comprises a OneNAND flash memory device.

13. A nonvolatile memory device, comprising:
a cell array comprising a plurality of memory cells;
a page buffer selectively precharging bitlines of selected memory cells in a sequence based on data stored in memory cells adjacent to the selected memory cells; and
a control logic controlling the page buffer to latch data stored in the adjacent memory cells prior to the selective precharging, and to determine the sequence of precharging based on the latched data.

14. The nonvolatile memory device of claim 13, wherein the adjacent memory cells are divided into aggressor cells and non-aggressor cells based on the latched data and selected memory cells adjacent to aggressor cells are sensed at a different time from selected memory cells adjacent to non-aggressor cells.

15. The nonvolatile memory device of claim 14, further comprising:
a voltage generator providing a first read voltage for reading selected memory cells adjacent to non-aggressor cells and a second read voltage for reading selected memory cells adjacent to aggressor cells.

16. The nonvolatile memory device of claim 13, further comprising a randomizer configured to perform a randomization operation to reorder data to be stored in the plurality of memory cells.

17. The nonvolatile memory device of claim 13, wherein the plurality of memory cells comprise multi-level cells.

18. The nonvolatile memory device of claim 13, wherein the aggressor cells exhibit capacitative coupling on the selected memory cells.

* * * * *